United States Patent [19]

Crowley

[11] 4,156,855

[45] May 29, 1979

[54] PHASE-LOCKED LOOP WITH VARIABLE GAIN AND BANDWIDTH

[75] Inventor: Albert T. Crowley, Somerdale, N.J.

[73] Assignee: RCA Corporation, New York, N.Y.

[21] Appl. No.: 872,563

[22] Filed: Jan. 26, 1978

[51] Int. Cl.² .............................................. H03B 3/04
[52] U.S. Cl. ..................................... 331/1 A; 331/17; 331/27
[58] Field of Search ..................... 331/1 A, 17, 18, 25, 331/27

[56] References Cited

U.S. PATENT DOCUMENTS

| 3,316,497 | 4/1967 | Brooks | 331/17 |
| 3,694,776 | 9/1972 | Linder | 331/17 X |
| 3,993,958 | 11/1976 | Cutsogeorge | 331/17 X |
| 4,053,933 | 10/1977 | Collins | 331/17 x |

Primary Examiner—Siegfried H. Grimm
Attorney, Agent, or Firm—Samuel Cohen; Carl V. Olson

[57] ABSTRACT

A phase locked loop includes a voltage-controlled oscillator, and a phase and frequency detector for comprising an input signal pulse wave with a pulse wave from the voltage-controlled oscillator, and for providing a frequency control voltage to the voltage-controlled oscillator. When the pulses overlap, a pulse comparison circuit in the phase and frequency detector produces a frequency "up" signal or a frequency "down" signal proportional to the correction necessary. When the pulses do not overlap, the pulse comparison circuit produces a "non-overlap" signal which effects a rapid frequency correction by causing a current pump in the phase and frequency detector to increase its output to a fixed maximum value, and by causing a loop filter to increase its bandwidth to a fixed maximum value.

4 Claims, 5 Drawing Figures

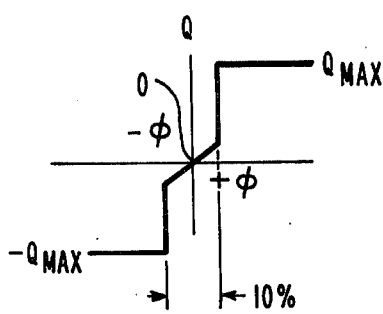
PHASE CHARACTERISTIC
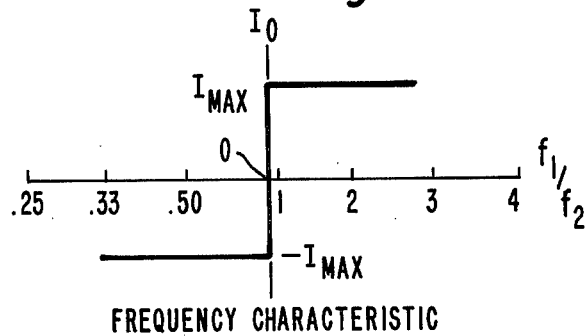
FREQUENCY CHARACTERISTIC
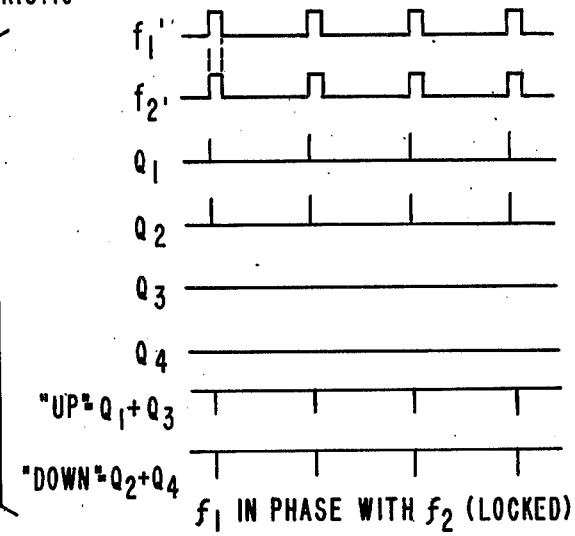
$f_1$ IN PHASE WITH $f_2$ (LOCKED)
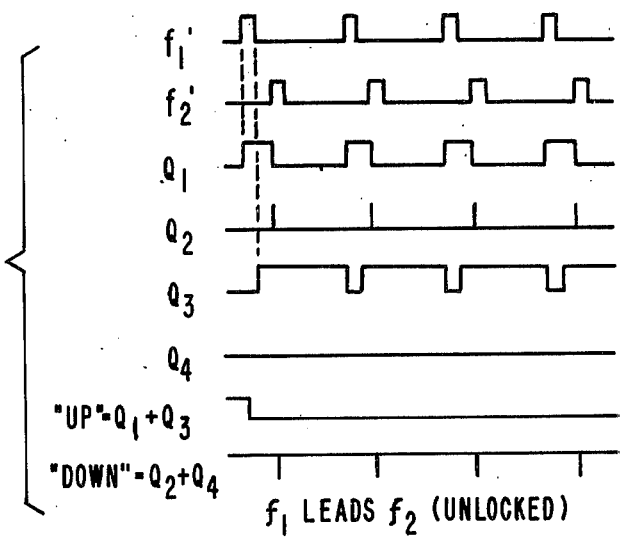
$f_1$ LEADS $f_2$ (UNLOCKED)

PHASE-LOCKED LOOP WITH VARIABLE GAIN AND BANDWIDTH

This invention relates to a phase locked loop useful, for example, in frequency synthesizers.

According to an example of the invention, a phase locked loop includes a phase and frequency detector for comparing input and oscillator pulses and for supplying a proportional correction voltage to the oscillator when the pulses overlap and for supplying a maximum correction voltage when the pulses do not overlap.

In the drawing:

FIG. 2 is a diagram describing the phase characteristics of the phase and frequency detector circuit included in FIG. 1;

FIG. 3 is a graph illustrating the frequency characteristics of the phase and frequency detector included in FIG. 1; and FIGS. 4 and 5 are charts of voltage waveforms which will be referred to in describing the operation of the phase and frequency detector of FIG. 1.

Figure 1:
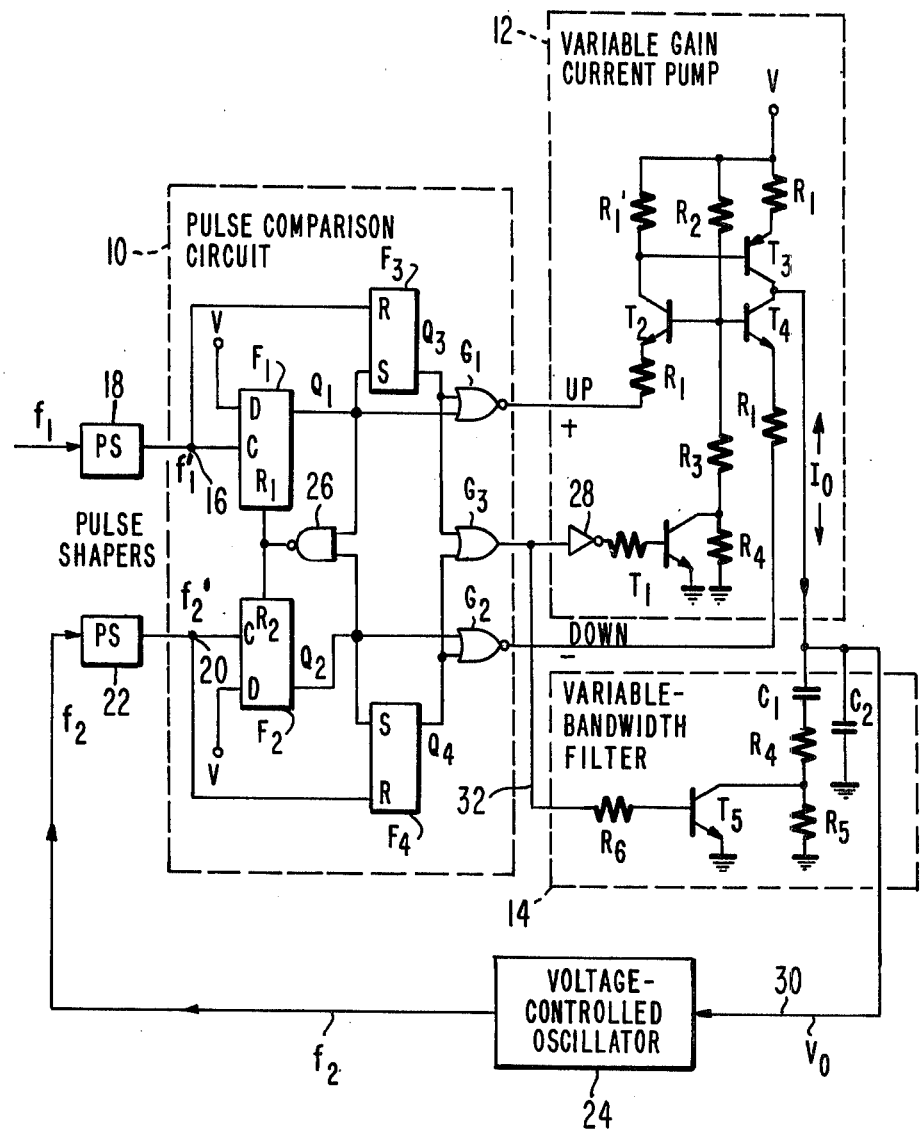
FIG. 1 is a schematic diagram of a phase locked loop constructed according to the teachings of the invention.

Referring now in greater detail to FIG. 1, the phase locked loop shown includes a phase and frequency detector consisting of a pulse comparison circuit 10, a variable-gain current pump 12, and a variable-bandwidth loop filter 14. The phase and frequency detector has a first input at 16 for a pulse wave signal $f_1'$ derived by a pulse shaper 18 from an input sine wave signal $f_1$, and has a second input at 20 for a pulse wave signal $f_2'$ derived by a pulse shaper 22 from the sine wave output $f_2$ from a voltage-controlled oscillator 24. The pulses of pulse waves $f_1'$ and $f_2'$ may have equal widths, equal to 10 percent of the periods of the waves. The actual percentage figure adopted for the widths of the pulses determines the dividing point between the two modes of operation of the phase locked loop, as will be apparent as the description proceeds. The output frequency $f_2$ from the oscillator 24 is controlled by a control signal $V_0$ generated by the phase and frequency detector including the pulse comparison circuit 10, the variable-gain current pump 12 and the variable-bandwidth filter 14.

The pulse comparison circuit 10 includes first and second positive-edge-triggered Type D flip-flops $F_1$ and $F_2$ having trigger inputs C for input pulse wave $f_1'$ and oscillator pulse wave $f_2'$ respectively, $Q_1$ and $Q_2$ outputs, respectively and reset inputs $R_1$ and $R_2$. Flip-flops $F_1$ and $F_2$ may be Type SN7474 units manufactured by Texas Instruments. A "nand" gate 26 has inputs from the $Q_1$ and $Q_2$ outputs of the two flip-flops $F_1$ and $F_2$, and has an output connected to the reset inputs of the two flip-flops.

Third and fourth flip-flops $F_3$ and $F_4$ are set-reset flip-flops which are set and reset on receipt at S and R, respectively, of positive voltage level signals. The flip-flops $F_3$ and $F_4$ have set outputs at $Q_3$ and $Q_4$, respectively. The flip-flops $F_3$ and $F_4$ may be constructed by cross coupling two "nor" gates such as the gates Type SN5402 manufactured by Texas Instruments.

The first input terminal 16 of the pulse comparison circuit is connected to the trigger input C of flip-flop $F_1$ and the reset input R of flip-flop $F_3$. The $Q_1$ output of flip-flop $F_1$ is connected to the set input of flip-flop $F_3$ and to one input of an "up" gate $G_1$ having another input from the $Q_3$ output of flip-flop $F_3$. Corresponding mirror image connections are made between second input terminal 20, second flip-flop $F_2$, fourth flip-flop $F_4$ and a "down" gate $G_2$. Gates $G_1$ and $G_2$ are "nor" gates. A "non-overlap" gate $G_3$ is an "or" gate having inputs from the $Q_3$ and $Q_4$ outputs of flip-flops $F_3$ and $F_4$.

The "up" and "down" outputs from pulse comparison circuit 10 are applied to input transistors $T_2$ and $T_4$ of a variable-gain current pump 12 having a gain control transistor $T_1$. In the normal condition when the system is in phase and frequency lock, current pump transistor $T_1$ is on, and transistors $T_2$, $T_3$ and $T_4$ are off. An "up" pulse from gate $G_1$ renders transistor $T_2$ conductive and the current drawn therethrough from resistor $R_1'$ causes transistor $T_3$ to conduct from source V to capacitor $C_1$ in the variable bandwidth filter 14. This increases the charge on the filter and increases the control voltage $V_0$. A "down" pulse from gate $G_2$ renders transistor $T_4$ conductive to draw charge from capacitor $C_1$ in filter 14 and cause a decrease in the charge on capacitor $C_1$ and in voltage $V_0$.

When the input pulses $f_1'$ and $f_2'$ overlap, the widths of the "up" and "down" pulses are proportional to the phase error between $f_1'$ and $f_2'$. "Up" pulses from "nor" gate $G_1$ have widths determined by the outputs of flip-flop $F_1$ at $Q_1$, which start at the leading edges of pulses $f'_1$ and end at the leading edges of pulses $f'_2$. "Down" pulses from "nor" gate $G_2$ have a widths determined by the outputs of flip-flop $F_2$ at $Q_2$, which start at the leading edges of pulses $f'_2$ and end at the leading edges of pulses $f'_1$. "Up" pulses represent a positive phase error, and "down" pulses represent a negative phase error. When $f_1'$ and $f_2'$ do not overlap, the appropriate "up" or "down" signal, depending upon the sense of the error, is turned on continuously in order to decrease the loop response time for large errors in phase or frequency, and in addition, the magnitude of the current generated by the current pump is increased by gain control transistor $T_1$. In the normal condition when pulses $f_1'$ and $f_2'$ overlap, transistor $T_1$ is normally-conductive, shorting out resistor $R_4$, and the magnitude of the output current $I_0$ of current pump 12 is:

$$\frac{V}{R_1} \cdot \frac{R_3}{R_2 + R_3} \qquad (1)$$

In this normal condition, $Q_3$ and $Q_4$ are both low and there is no output signal from "non-overlap" gate $G_3$. However, when pulses $f_1'$ and $f_2'$ do not overlap, there is an output from flip-flop $F_3$ or flip-flop $F_4$ causing an output from "non-overlap" gate $G_3$, which is inverted by an inverter 28 and renders transistor $T_1$ cut off so that resistor $R_4$ is placed in series with resistors $R_2$ and $R_3$. The current pump then has a maximum output current given by the formula:

$$\frac{V_1}{R_1} \cdot \frac{R_3 + R_4}{R_2 + R_3 + R_4}$$

In other words, the output current $I_0$ increases.

The current pulses from the junction between the transistors $T_3$ and $T_4$ in the variable-gain current pump are applied to the variable-bandwidth filter 14 to generate the frequency-control voltage $V_0$ applied to input 30 of the voltage-controlled oscillator 24. In the normal condition when pulses $f_1'$ and $f_2'$ overlap, $Q_3$ and $Q_4$ are both low, there is no output signal from "non-overlap" gate $G_3$, transistor $T_5$ is cut off and resistor $R_5$ is in series with resistor $R_4$ and capacitor $C_1$ in the filter circuit. However, when pulses $f_1'$ and $f_2'$ do not overlap, there is an output from "non-overlap" gate $G_3$ which is coupled over path 32 and resistor $R_6$ to make transistor $T_5$ conductive. The collector-emitter path of this conducting transistor acts as a short circuit across filter resistor $R_5$ and with this resistor short-circuited, the filter has a maximum bandwidth. The maximum bandwidth is needed to effect a rapid change in control voltage $V_0$ and correction of oscillator frequency, and the normal narrower bandwidth is provided when synchronization is achieved to minimize the effects of spurious pulse disturbances in the feedback loop.

The operation of the phase locked loop of FIG. 1 is illustrated by the phase characteristic shown in FIG. 2 and the frequency characteristic shown in FIG. 3. When the input pulse wave $f_1'$ and the oscillator pulse wave $f_2'$ are exactly equal in phase and frequency, the pulse width of the frequency correction current pulse applied to the variable bandwidth filter 14 is zero. This condition is represented by the origins 0 in FIGS. 2 and 3. If the phases of the pulse waves differ slightly with the pulses overlapping, the pulse width of the correction current pulse is increased and the current applied to filter 14 and stored as a charge or capacitor $C_1$ produces a control voltage $V_0$ which has a positive value proportional to the phase difference, as represented by the sloping line in the FIG. 2 phase characteristic between the limits labeled 10%. The range 10% applies where the pulse widths are 10% of the periods of the pulse waves. If the pulse waves differ in phase by more than 10% so that the pulses do not overlap, the "non-overlap" condition is detected by the pulse comparison circuit 10, with the result that the variable-gain current pump 12 produces a correction current $I_0$ equal to $I_{max}$ or $-I_{max}$ continuously until such time as the phases of the pulse waves are close enough so that the pulses overlap. FIG. 3 shows that whenever the frequencies of the pulse waves are different, the correction current $I_0$ applied to the filter 14 is always $I_{max}$ or $-I_{max}$ because, when the frequencies are different the pulses do not overlap, except during a very small percentage of the time.

To summarize, when the input pulses overlap, frequency correction current pulses whose widths are proportional to the phase difference are supplied to the variable bandwidth filter 14. This current is integrated by filter 14 to produce a voltage $V_0$ which is supplied to the oscillator 24. When the input pulses do not overlap, a maximum plus or minus frequency correction current is applied continuously to the filter.

The operation of the pulse comparison circuit 10 will be described with references to waveforms shown in FIGS. 4 and 5. FIG. 4 shows the condition in which the input pulse wave $f_1'$ and the oscillator pulse wave $f_2'$ are exactly equal in phase (and frequency). Flip-flops $F_1$ and $F_2$ both get set and produce outputs $Q_1$ and $Q_2$, but the flip-flops are both immediately reset via "nand" gate 26. Therefore the outputs $Q_1$ and $Q_2$ are mere minimum-duration spikes passed by both "or" gates $G_1$ and $G_2$ to the current pump 12 where they have cancelling effects so that the correction current $I_0$ is zero.

FIG. 5 illustrates the condition where input pulse wave $f_1'$ has a leading phase relative to oscillator pulse wave $f_2'$ and the phase difference is great enough so that the pulses do not overlap. Flip-flop $F_1$ is set by the leading edge of pulse $f_1'$ and it stays set producing a $Q_1$ pulse until flip-flop $F_1$ is reset through gate 26 when flip-flop $F_2$ is set by pulse $f_2'$. The leading edge of pulse $f_1'$ also resets flip-flop $F_3$ and it remains reset with $Q_3$ low until the trailing edge of pulse $f_1'$ occurs and the $Q_1$ output of flip-flop $F_1$ sets flip-flop $F_3$ and makes $Q_3$ high. Flip-flop $F_3$ remains set with $Q_3$ high until the flip-flop is reset by the next pulse $f_1'$. One or the other or both of pulses $Q_1$ and $Q_3$ are always present to provide a continuous "up" signal at the output of "or" gate $G_1$. The "up" signal turns on current pump 12 and applies a correction current to filter 14 from which a correction voltage $V_0$ is applied to voltage-controlled oscillator 24.

While the current pump 12 is turned on by the "up" signal, flip-flop $F_3$ is set and providing an output $Q_3$ in the long intervals between pulses $f_1'$ through the "non-overlap" gate $G_3$. This "non-overlap" signal acts through transistor $T_1$ to increase the amplitude of the current pulse, producing a faster than normal frequency correction. The "non-overlap" signal also acts through transistor $T_5$ to make loop filter 32 have its maximum bandwidth. The maximum "up" current signal generated by current pump 12 and the maximum bandwidth in filter 14 cooperate to cause the phase and the frequency of the oscillator to be very rapidly changed into phase and frequency lock with the input signal $f_1$. When oscillator pulse wave $f_2'$ leads input pulse wave, $f_1'$, a similar but opposite correction of the oscillator frequency is made as the result of the generation of a "down" signal.

What is claimed is:

1. A phase locked loop, comprising
   a voltage-controlled oscillator,
   a phase and frequency detector,
   a first pulse shaper coupling an input signal wave to a first input of said phase and frequency detector,
   a second pulse shaper coupling an output of said voltage-controlled oscillator to a second input of said phase and frequency detector,
   said phase and frequency detector including:
   a pulse comparison circuit operative when pulses from the pulse shapers overlap to produce "up" signal pulses having widths proportional to the phase difference when the pulses from the first pulse shaper lead, and to produce "down" signal pulses having widths proportional to the phase difference when the pulses from the second pulse shaper lead, and producing a "non-overlap" signal when the pulses of waves from said first and second pulse shapers do not ovelap,
   a variable-gain current pump means responsive to said "up" and "down" signals to produce an output signal varying in amplitude and polarity with the amount and polarity of the phase difference between the pulse waves from said first and second pulse shapers when the pulses overlap,
   means to apply said "non-overlap" signal to said current pump to increase the gain thereof to a fixed maximum value, and
   a loop filter coupling the output of said variable-gain current pump to the voltage control input of said voltage-controlled oscillator.

2. The combination as defined in claim 1 wherein said loop filter is a variable-bandwidth loop filter.

3. The combination as defined in claim 2 and, in addition, means to apply said "non-overlap" signal to said filter to increase the bandwidth thereof to a fixed maximum value.

4. The combination as defined in claim 1 wherein said pulse comparison circuit comprises first and second flip-flops each having a leading edge trigger input, a set output and a reset input,
a gate coupling the set outputs of said first and second flip-flops to the reset inputs of the flip-flops so that the flip-flops cannot both remain set,
third and fourth flip-flops having set inputs coupled to set outputs of respective first and second flip-flops and having reset inputs and set outputs,
means coupling the output of said first pulse shaper to the trigger input of said first flip-flop and the reset input of said third flip-flop,
means coupling the output of said voltage-controlled oscillator through said second pulse shaper to the trigger input of said second flip-flop and the reset input of said fourth flip-flop,
first gate means responsive to output of said first and third flip-flops to generate said "up" signal pulses,
second gate means responsive to outputs of said second and fourth flip-flops to generate said "down" signal pulses, and
third gate means responsive to outputs of said third and fourth flip-flops to generate said "non-overlap" signal when pulses of first and second pulse waves do not overlap.

* * * * *